United States Patent
Kurata et al.

(10) Patent No.: US 7,367,870 B2
(45) Date of Patent: May 6, 2008

(54) POLISHING FLUID AND POLISHING METHOD

(75) Inventors: Yasushi Kurata, Hitachi (JP); Katsuyuki Masuda, Shimodate (JP); Hiroshi Ono, Hitachi (JP); Yasuo Kamigata, Tsukuba (JP); Kazuhiro Enomoto, Mito (JP)

(73) Assignee: Hitachi Chemical Co. Ltd., Tokyo (JP)

( * ) Notice: Subject to any disclaimer, the term of this patent is extended or adjusted under 35 U.S.C. 154(b) by 424 days.

(21) Appl. No.: 10/513,002

(22) PCT Filed: Apr. 28, 2003

(86) PCT No.: PCT/JP03/05465

§ 371 (c)(1),
(2), (4) Date: Oct. 29, 2004

(87) PCT Pub. No.: WO03/094216

PCT Pub. Date: Nov. 13, 2003

(65) Prior Publication Data

US 2005/0181609 A1    Aug. 18, 2005

(30) Foreign Application Priority Data

Apr. 30, 2002  (JP) .............................. 2002-128644
May 31, 2002   (JP) .............................. 2002-160159

(51) Int. Cl.
*C09K 13/00* (2006.01)

(52) U.S. Cl. .............................. 451/36; 451/41; 51/308

(58) Field of Classification Search ................ 451/36, 451/41; 252/79.1, 79.2; 51/307, 309, 308; 216/88, 89; 438/892
See application file for complete search history.

(56) References Cited

U.S. PATENT DOCUMENTS

| | | | |
|---|---|---|---|
| 4,944,836 A | | 7/1990 | Beyer et al. |
| 5,476,606 A * | | 12/1995 | Brancaleoni et al. ...... 252/79.1 |
| 6,355,075 B1 | | 3/2002 | Ina et al. |
| 6,863,592 B2 * | | 3/2005 | Lee et al. ..................... 451/36 |
| 2002/0061635 A1 | | 5/2002 | Lee et al. |
| 2004/0134873 A1 * | | 7/2004 | Yao et al. ...................... 216/2 |
| 2005/0173669 A1 * | | 8/2005 | Kurata et al. ............... 252/79.1 |

FOREIGN PATENT DOCUMENTS

| | | |
|---|---|---|
| EP | 0 659 858 | 6/1995 |
| EP | 1 125 999 A1 | 8/2001 |
| JP | 2-278822 | 11/1990 |
| JP | 8-83780 | 3/1996 |
| JP | 2819196 | 8/1998 |
| JP | 2000-340532 | 12/2000 |
| JP | 2001-68437 | 3/2001 |
| JP | 2001-85372 | 3/2001 |
| JP | 2001-085372 A | 3/2001 |
| JP | 2001-127019 | 5/2001 |
| JP | 2003/100672 | 4/2003 |
| JP | 2003-151926 | 5/2003 |

OTHER PUBLICATIONS

F. B. Kaufman et al.; Journal of The Electrochemical Society, Inc., vol. 138, No. 11, pp. 3460-3465. Nov. 1991. Cited in the specification.
Chinese Office Action dated Nov. 17, 2006, issued in corresponding Chinese Patent Application No. 038095904.
Office Action dated Feb. 24, 2006 issued in corresponding Korea Application No. 2006-011044552.
European Search Report dated Nov. 29, 2007, issued in corresponding European Patent Application No. 07 02 0898.

* cited by examiner

*Primary Examiner*—Jacob K. Ackun, Jr.
(74) *Attorney, Agent, or Firm*—Westerman, Hattori, Daniels & Adrian, LLP.

(57) ABSTRACT

A polishing slurry including an oxidant, a metal oxide dissolver, a metal inhibitor and water and having a pH from 2 to 5. The metal oxide dissolver contains one or more compounds selected from one or more acids (A-group) selected from acids of which the negative value of the logarithm of the dissociation constant Ka (pKa) of a first dissociable acid group is less than 3.7 and from which five acids of lactic acid, phthalic acid, fumaric acid, maleic acid and aminoacetic acid are excluded, ammonium salts of the A-group and esters of the A-group, and one or more compounds selected from one or more acids (B-group) selected from acids of which the negative value of the logarithm of the dissociation constant Ka (pKa) of a first dissociable acid group is 3.7 or more and the five acids, ammonium salts of the B-group and esters of the B-group. The metal inhibitor contains one or more types selected from the group consisting of aromatic compounds having a triazole skeleton and one or more types selected from the group consisting of aliphatic compounds having a triazole skeleton and compounds having any one of pyrimidine skeleton, imidazole skeleton, guanidine skeleton, thiazole skeleton and pyrazole skeleton. The polishing slurry having a high metal-polishing rate, reducing etching rate and polishing friction, results in the production, with high productivity, of semiconductor devices reduced in dishing and erosion in metal wiring.

19 Claims, 1 Drawing Sheet

POLISHING FLUID AND POLISHING METHOD

BACKGROUND OF THE INVENTION

1. Field of the Invention

The present invention relates to a polishing slurry, particularly, a polishing slurry used in a process of forming wiring of a semiconductor device and to a polishing method using the polishing slurry.

2. Description of the Related Art

New technologies for fine processing have been recently developed along with the development of highly integrated and high performance semiconductor integrated circuits (LSIs). A Chemical mechanical polishing method (hereinafter referred to as CMP) is among these technologies and is techniques which are being frequently utilized to flatten an interlayer dielectric film, to form a metal plug and to form embedded wiring in a process of producing LSIs and, particularly, a process of forming multi-layer wiring. These techniques are disclosed in, for example, U.S. Pat. No. 4,944,836.

In recent years, an attempt has been made to utilize copper alloys as wiring materials to develop high performance LSIs. However, these copper alloys have difficulties in fine processing carried out by a dry etching method which is frequently used to form conventional aluminum alloy wiring. For this, a so-called damascene method is primarily adopted in which a copper alloy thin film is deposited on a dielectric film in which a groove has been formed in advance and embedded in this groove and the copper alloy thin film on the dielectric film except for the groove portion is removed by CMP to form embedded wiring. These technologies are disclosed in, for example, the publication of Japanese Patent Application Laid-Open (JP-A) No. 2-278822.

In a general method used for CMP of a metal, a polishing cloth (pad) is applied to a circular polishing table (platen), the surface of the polishing cloth is moistened with a polishing slurry, the surface of a base body on which surface a metal film is formed is pressed against the polishing cloth and the polishing table is rotated in the condition that specified pressure (polishing pressure or polishing load) is applied to the backside of the base body to remove the metal film of the convex parts through mechanical contact with the convex parts by the aid of the polishing slurry.

The polishing slurry used in CMP usually comprises an oxidant and abrasive, to which a metal oxide dissolver and a metal inhibitor are further added according to the need. It is considered to be a fundamental mechanism that first, the surface of the metal film is oxidized by oxidation and the resulting oxide layer is shaven off by the solid abrasive. The oxide layer on the metal surface in the concave parts is not almost in contact with the polishing cloth, so that the solid abrasive has no shaving effect on that oxide layer in the concave parts. Therefore, along with the progress of CMP, the metal layer on the convex parts is removed and the surface of the base body is flattened. The details of this mechanism are disclosed in Journal of Electrochemical Society, Vol. 138, No. 11 (issued in 1991), pp3460–3464.

It is regarded as effective to add a metal oxide dissolver as a method of raising polishing rate by CMP. The interpretation of such a result may be that when metal oxide grains shaven off by the solid abrasive is dissolved in the polishing slurry, the shaving effect of the solid abrasive is increased. However, if the oxide layer on the surface of the metal film in the concave parts is also etched and the surface of the metal film is thereby exposed, the surface of the metal oxide film is more oxidized by the oxidant. The repetition of this process leads to the progress of etching of the metal film in the concave parts and there is therefore a fear that the flattening effect is impaired. In order to wipe away this fear, a metal inhibitor is added. In order to maintain flattening characteristics, it is important to balance the effect of the metal oxide dissolver with that of the metal inhibitor and it is desirable that the oxide layer on the surface of the metal film in the convex parts is not much etched but grains of the oxide layer shaven off be dissolved effectively, resulting in a high polishing rate in CMP.

An acid as the metal oxide dissolver and the metal inhibitor are added in this manner to add the effect of a chemical reaction, whereby not only the polishing rate in CMP is improved but also such an effect is obtained that damages to the surface of the metal layer which surface is polished chemically and mechanically are reduced.

However, the formation of wiring by conventional CMP poses the problems, for example, (1) the occurrence of a phenomenon (dishing) that the center part of the surface of the embedded metal wiring is isotropically etched to form a dish-like cave and the occurrence of a phenomenon (erosion or thinning) that the dielectric film is also etched in a part having high wiring density and the thickness of the metal wiring is reduced, (2) the occurrence of polishing scratches, (3) a complicated washing process used to remove a polishing residue left on the surface of the base body after the base body is polished, (4) increased cost caused by waste fluid treatment and (5) corrosion of metals.

In order to suppress dishing and the corrosion of a copper alloy during polishing to thereby form highly reliable LSI wiring, a method using a polishing slurry containing a metal oxide dissolver including an aminoacetic acid such as glycine or sulfuric acid amide and BTA (benzotriazole) is proposed. These technologies are described in, for example, the publication of JP-A No. 8-83780.

In the formation of an embedded metal such as the formation of damascene wiring of copper or a copper alloy and the formation of plug wiring of tungsten, such an erosion phenomenon occurs that the wiring including the interlayer dielectric film is made thin when the rate of the polishing of a silicone dioxide film which is the interlayer dielectric film formed on a portion except for the embedded portion is also high. As a result, an increase in wiring resistance and pattern density causes the dispersion of resistance and it is therefore demanded of the polishing slurry to have the characteristics that the rate of the polishing of the silicone dioxide film is sufficiently lower than that of the metal film to be polished. For this, a method is proposed in which the pH of a polishing slurry is made larger than (pKa—0.5) to limit the speed of the polishing of silicon dioxide by anions produced by the dissociation of an acid. These technologies are described in, for example, the publication of Japanese Patent No. 2819196.

In the meantime, a barrier layer constituted of tantalum, titanium, tungsten or tantalum nitride, titanium nitride, tungsten nitride and a tantalum alloy, titanium alloy, tungsten alloy or other tantalum compounds, titanium compounds and tungsten compounds is formed as a layer disposed under the copper or copper alloy wiring to prevent copper from diffusing into the interlayer dielectric film. It is therefore necessary to remove the exposed barrier layer except for that of the wiring part used to embed copper or a copper alloy by CMP. However, these barrier layer conductive film has higher hardness than copper or a copper alloy and a combination of polishing materials used for copper or a copper alloy therefore fails in obtaining sufficient CMP rate, giving rise to the problem that dishing of copper or a copper alloy is caused, which decreases the thickness of the wiring during the removal of the barrier layer by CMP. Therefore, studies are being made as to a two-stage polishing method involving a first step of polishing copper or a copper alloy and a second step of polishing the barrier layer conductor.

The polishing slurry used to polish copper or a copper alloy can succeed in obtaining high polishing rate by adding a metal oxide dissolver to adjust the pH to the acidic side. In the acidic range, however, copper or copper alloy wiring is easily corroded. For this, it is necessary to increase the concentration of a corrosion inhibitor in the polishing slurry, to decrease the concentration of the metal oxide dissolver in the polishing slurry or to use a less corrosive acid having a high pKa.

In recent LSI fields, studies have been made as to technologies using an interlayer dielectric film having a small dielectric constant to decrease the signal delay time of metal wiring. However, because these interlayer films and laminate film structure using these interlayer films have small mechanical strength, wiring inferiors are easily caused by, for example, peeling at the boundary between laminate films. This is the reason why it has been desired to reduce friction in a polishing process.

As regards the polishing slurry used to polish copper or a copper alloy, if the concentration of the corrosion inhibitor is increased when an acid having a low pKa is used and the concentration of the metal oxide dissolver is increased to obtain a high polishing rate, the coefficient of polishing friction (coefficient of dynamic friction) during polishing tends to be increased, giving rise to problems concerning, for example, peeling and wire breaking of metal wiring and its laminate film structure. Also, a rise in temperature caused by friction leads to an increase in the chemical etching effect of the polishing slurry, causing the metal wiring to be etched, posing problems, for example, large dishing.

On the other hand, when an acid which has a high pKa and is hence less corrosive is used and the concentration of the metal oxide dissolver is dropped, there is the problem that only insufficient polishing rate is obtained. Also, when the pH of the polishing slurry is increased, only insufficient polishing rate is obtained.

In view of this situation, it is an object of the present invention to provide a polishing slurry which has a high metal-polishing rate, reduces etching rate and friction during polishing, and hence results high productivity and reduces dishing and erosion, and to provide a polishing method using the polishing slurry. The present invention can provide a highly reliable semiconductor device which is minimized, thin-filmed and is superior in dimensional accuracy and electric characteristics.

SUMMARY OF THE INVENTION

Accordingly, the polishing slurry of the present invention relates to the following polishing slurry and polishing method.

(1) A polishing slurry comprising (i) an oxidant, (ii) a metal oxide dissolver, (iii) a metal inhibitor and water and having a pH from 2 to 5, wherein;

the metal oxide dissolver (ii) contains one or more types selected from one or more acids (A-group) selected from acids of which the negative value of the logarithm of the dissociation constant Ka (pKa) of a first dissociable acid group is less than 3.7 and from which lactic acid, phthalic acid, fumaric acid, maleic acid and amino acetic acid are excluded, ammonium salts of the A-group acids and esters of the A-group acids, and one or more types selected from one or more acids (B-group) selected from acids of which the negative value of the logarithm of the dissociation constant Ka (pKa) of a first dissociable acid group is 3.7 or more, lactic acid, phthalic acid, fumaric acid, maleic acid and aminoacetic acid, ammonium salts of the B-group acids and esters of the B-group acids.

(2) A polishing slurry comprising (i) an oxidant, (ii) a metal oxide dissolver, (iii) a metal inhibitor and water and having a pH from 2 to 5, wherein;

the metal inhibitor (iii) contains one or more types selected from the group (C-group) consisting of aromatic compounds having a triazole skeleton and one or more types selected from the group (D-group) consisting of aliphatic compounds having a triazole skeleton, compounds having a pyrimidine skeleton, compounds having an imidazole skeleton, compounds having a guanidine skeleton, compounds having a thiazole skeleton and compounds having a pyrazole skeleton.

(3) A polishing slurry according to the above (1), wherein;

the A-group consists of malonic acid, citric acid, malic acid, glycolic acid, glutamic acid, gluconic acid, oxalic acid, tartaric acid, picolinic acid, nicotinic acid, mandelic acid, acetic acid, sulfuric acid, nitric acid, phosphoric acid, hydrochloric acid and formic acid; and the B-group consists of succinic acid, adipic acid, glutaric acid, benzoic acid, quinaldinic acid, butyric acid, valeric acid, lactic acid, phthalic acid, fumaric acid, maleic acid and aminoacetic acid.

(4) A polishing slurry according to any one of the above (1) to (3), wherein the metal oxide dissolver (ii) includes either a combination of acids selected from the following combinations of acids or a combination in which at least one of the combination selected from the following combinations of acids is an ammonium salt of an acid:

malonic acid and succinic acid, malonic acid and glutaric acid, malonic acid and adipic acid, malonic acid and lactic acid, malonic acid and fumaric acid, malonic acid and phthalic acid, citric acid and succinic acid, citric acid and glutaric acid, citric acid and adipic acid, citric acid and lactic acid, citric acid and fumaric acid, citric acid and phthalic acid, malic acid and succinic acid, malic acid and glutaric acid, malic acid and adipic acid, malic acid and lactic acid, malic acid and fumaric acid, malic acid and phthalic acid, glycolic acid and succinic acid, glycolic acid and glutaric acid, glycolic acid and adipic acid, glycolic acid and lactic acid, glycolic acid and fumaric acid, glycolic acid and phthalic acid, tartaric acid and succinic acid, tartaric acid and glutaric acid, tartaric acid and adipic acid, tartaric acid and lactic acid, tartaric acid and fumaric acid and tartaric acid and phthalic acid.

(5) A polishing slurry according to any one of the above (1), (3) and (4), wherein the metal inhibitor (iii) contains one or more types selected from compounds having a triazole skeleton, compounds having a pyrimidine skeleton, compounds having an imidazole skeleton, compounds having a guanidine skeleton, compounds having a thiazole skeleton and compounds having a pyrazole skeleton.

(6) A polishing slurry according to the above (2), wherein the above C-group is at least one type selected from benzotriazole, 1-hydroxybenzotriazole and 5-methylbenzotriazole.

(7) A polishing slurry according to the above (2) or (6), wherein the aliphatic compound having a triazole skeleton of the D-group is at least one type selected from 1,2,3-triazole, 1,2,4-triazole, 3-amino-1H-1,2,4-triazole and 4-amino-4H-1,2,4-triazole.

(8) A polishing slurry according to any one of the above (2) and (5) to (7), wherein the compound having a pyrimidine skeleton is at least one type selected from 4-aminopyrazolo[3,4-d]pyrimidine, 1,2,4-triazolo[1,5-a]pyrimidine, 2-methyl-5,7-diphenyl-(1,2,4)triazolo(1,5-a)pyrimidine and 2-methylsulfanyl-5,7-diphenyl-(1,2,4)triazolo(1,5-a)pyrimidine.

(9) A polishing slurry according to any one of the above (2) and (5) to (8), wherein the compound having an imidazole skeleton is at least one type selected from 2-methylimidazole, 2-ethylimidazole, 2-(isopropyl)imidazole, 2-propylimidazole, 2-butylimidazole, 4-methylimidazole, 2,4-dimethylimidazole and 2-ethyl-4-methylimidazole.

(10) A polishing slurry according to any one of the above (2) and (5) to (9), wherein the compound having a guanidine skeleton is at least one type selected from 1,3-diphenylguanidine and 1-methyl-3-nitroguanidine.

(11) A polishing slurry according to any one of the above (1) to (10), wherein the pH is 3 to 4.5 and the concentration of the metal inhibitor in the polishing slurry is 0.01 to 0.50% by weight.

(12) A polishing slurry according to any one of the above (1) to (11), wherein the metal oxide (i) is at least one type selected from hydrogen peroxide, ammonium persulfate, ferric nitrate, nitric acid, potassium periodate, hypochlorous acid and ozone water.

(13) A polishing slurry according to any one of the above (1) to (12), the slurry comprising at least one water-soluble polymer having a weight average molecular weight of 500 or more.

(14) A polishing slurry according to the above (13), wherein the water-soluble polymer having a weight average molecular weight of 500 or more is at least one type selected from polysaccharides, polycarboxylic acids, esters of polycarboxylic acids, salts of polycarboxylic acids, polyacrylamides and vinyl type polymers.

(15) A polishing slurry according to any one of the above (1) to (14), the slurry comprising one or more solid abrasive types selected from alumina, silica and ceria.

A first polishing method according to the present invention comprises polishing the surface to be polished of a base body by moving a polishing cloth and the base body relatively under the condition that the surface to be polished is pressed against the polishing cloth with supplying anyone of the above polishing slurries (1) to (15) of the present invention to the surface of the polishing cloth on an polishing table.

A second polishing method according to the present invention comprises a first polishing step of polishing a metal layer of a substrate provided with an interlayer dielectric film whose surface is constituted of concave portions and convex portions, a barrier layer which covers the interlayer dielectric film along the surface thereof and the metal layer with which the concave portions are filled and which covers the barrier layer, to expose the barrier layer on the convex portions, and a second polishing step of polishing at least the barrier layer and the metal layer in the concave portions to expose the interlayer dielectric film on the convex portions after the first polishing step, wherein any one of the polishing slurries (1) to (15) of the present invention is used to polish in at least one of the first and second polishing steps.

In the polishing method of the present invention, the metal layer preferably contains at least one type selected from copper, a copper alloy, a copper oxide and a copper alloy oxide. It is also preferable that the barrier layer have a monolayer structure consisting of one composition or a laminate structure consisting of two or more compositions, and the composition of the barrier layer be selected from among tantalum, tantalum nitride, a tantalum alloy, other tantalum compounds, titanium, titanium nitride, a titanium alloy, other titanium compounds, tungsten, tungsten nitride, a tungsten alloy and other tungsten compounds.

BRIEF DESCRIPTIONS OF THE DRAWINGS

DESCRIPTION OF THE PREFERRED EMBODIMENTS

Figure 1:
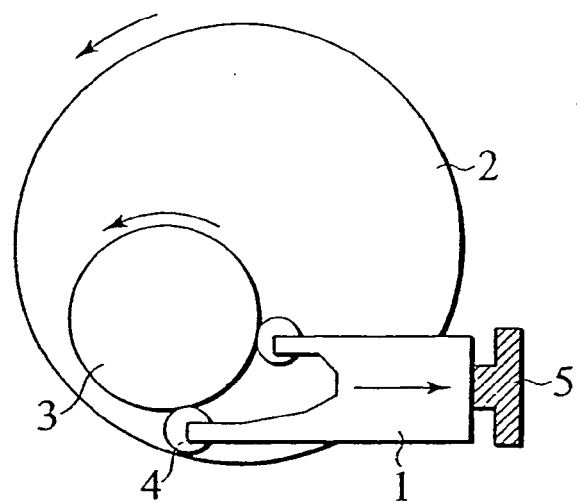
FIG. 1 is a top plan view typically showing one example of a wafer polisher equipped with a movable carrier holder, wherein 1 represents a carrier holder, 2 represents a polishing table, 3 represents a carrier, 4 represents a roller and 5 represents a piezoelectric element.

The details of the present invention will be explained.

The polishing slurry of the present invention contains (i) an oxidant, (ii) a metal oxide dissolver, (iii) a metal inhibitor and water as major structural components.

Examples of the oxidant (i) in the present invention include metal oxidants such as hydrogen peroxide, ammonium persulfate ferric nitrate, nitric acid, potassium periodate, hypochlorous acid and ozone water. Among these compounds, hydrogen peroxide is especially preferable. These compounds may be either singly or by mixing two or more. In the case where the base body having a surface to be polished which is a subject to be treated with the polishing slurry is a silicon substrate including integrated circuit elements, an oxidant containing no nonvolatile component is preferably used because contamination with alkali metals, alkali earth metals, halides and the like is undesirable. However, ozone water is changed violently in composition with time and therefore hydrogen peroxide is most preferable. When the base body is, for example, a glass substrate containing no semiconductor element, an oxidant containing nonvolatile component may be used without any problem.

As the metal oxide dissolver (ii), the following acids, ammonium salts of these acids and esters of these acids are exemplified and water-soluble types may be used without any particular limitation. Examples of the acid include malonic acid, citric acid, malic acid, glutamic acid, gluconic acid, glycolic acid, succinic acid, lactic acid, adipic acid, glutaric acid, benzoic acid, phthalic acid, fumaric acid, maleic acid, aminoacetic acid, oxalic acid, tartaric acid, picolinic acid, nicotinic acid, mandelic acid, acetic acid, sulfuric acid, nitric acid, phosphoric acid, hydrochloric acid, formic acid, quinaldinic acid, butyric acid, valeric acid, salicylic acid, glyceric acid and pimelic acid.

In the metal oxide dissolver (ii) used in the present invention, particularly, one or more acids selected from among acids of which the negative value of the logarithm of the dissociation constant Ka (pKa) of a first dissociable acid group is less than 3.7 and from which lactic acid, phthalic acid, fumaric acid, maleic acid and aminoacetic acid are excluded are hereinafter called a A-group. A compound selected from the A-group acids, ammonium salts of the A-group acids and esters of the A-group acids is hereinafter called a compound A.

Also, in the metal oxide dissolver (ii) used in the present invention, one or more acids selected from acids of which the negative value of the logarithm of the dissociation constant Ka (pKa) of a first dissociable acid group is 3.7 or more, lactic acid (pKa: 3.66), phthalic acid (pKa: 2.75), fumaric acid (pKa: 2.85), maleic acid (pKa: 1.75) and aminoacetic acid (pKa: 2.36) are hereinafter called a B-group. A compound selected from the B-group acids, ammonium salts of the B-group acids and esters of the B-group acids are hereinafter called a compound B.

The negative value of the logarithm of the dissociation constant Ka (pKa) of the first dissociable acid group of each of lactic acid, phthalic acid, fumaric acid, maleic acid and aminoacetic acid is less than 3.7. However, these acids are classified as the B-group because these acids have a relatively small etching action on metals.

As the metal inhibitor (iii) in the present invention, compounds having a triazole skeleton, compounds having a pyrimidine skeleton, compounds having an imidazole skeleton, compounds having a guanidine skeleton, compounds having a thiazole skeleton and compounds having a pyrazole skeleton are exemplified and there is no particular limitation to it.

As the metal inhibitor (iii) used in the present invention, particularly, a group of aromatic compounds having a triazole skeleton is hereinafter called a C-group and also, aliphatic compounds having a triazole skeleton, compounds having a pyrimidine skeleton, compounds having an imidazole skeleton, compounds having a guanidine skeleton, compounds having a thiazole skeleton and compounds having a pyrazole skeleton are hereinafter called a D-group.

The polishing slurry of the present invention has the features that it meets at least one of the demands that;

one or more of the above compound A and one or more of the above compound (B) are contained as the metal oxide dissolver (ii) and that;

one or more types selected from the above C-group and one or more types selected from the above D-group are contained as the metal inhibitor (iii).

It is effective to contain two or more of the metal inhibitor (iii) and/or two or more of the metal oxide dissolver (ii) in the point that polishing friction can be suppressed efficiently while maintaining the balance between practical CMP rate and etching rate in spite of a low concentration of a metal inhibitor.

Examples of the acid included in the A-group include malonic acid, citric acid, malic acid, glycolic acid, glutamic acid, oxalic acid, tartaric acid, picolinic acid, nicotinic acid, mandelic acid, sulfuric acid, nitric acid, phosphoric acid, hydrochloric acid and formic acid.

Examples of the acid included in the B-group include succinic acid, adipic acid, glutaric acid, benzoic acid, quinaldinic acid, butyric acid, valeric acid, lactic acid, phthalic acid, fumaric acid, maleic acid, gluconic acid, actic acid, 1aminoacetic acid, salicylic acid, glyceric acid and pimelic acid.

Examples of the esters formed from these A-group or B-group acids include alkyl esters such as methyl esters, ethyl esters, 1-propylesters, 2-propylesters, 1-butylesters, 2-butylesters, 3-butylesters and t-butylesters. Methylesters, ethylesters, 1-propylesters and 2-propylesters are more preferable.

The compound A may include two or more different acids included in the group-A. Also, compound A may include two or all three of the acid, ammonium salt and ester. In this case, each of the acid, ammonium salt and ester may use a different acid in the A-group. This is the same to the compound B.

It is preferable that the A-group acid be selected from malonic acid, citric acid, malic acid, glycolic acid, gluconic acid, oxalic acid, tartaric acid, picolinic acid, nicotinic acid, mandelic acid, sulfuric acid, nitric acid, phosphoric acid, hydrochloric acid and formic acid and the B-group acid be selected from succinic acid, adipic acid, glutaric acid, benzoic acid, quinaldinic acid, butyric acid, valeric acid, lactic acid, phthalic acid, fumaric acid, maleic acid, gluconic acid, actic acid and aminoacetic acid in view of, particularly, a good balance between metal polishing rate and etching rate.

The metal oxide dissolver (ii) preferably contains the compound A and the compound B on the premise that the combination of the A-group and the B-group is one or more of the following combinations in the point that etching rate can be suppressed efficiently while maintaining practical CMP rate.

It is more preferable that metal oxide dissolver (ii) include a combination of acids selected from the following combinations of acids or a combination in which at least one of the combination is an ammonium salt of an acid.

(Combination) Malonic acid and succinic acid, malonic acid and glutaric acid, malonic acid and adipic acid, malonic acid and lactic acid, malonic acid and fumaric acid, malonic acid and phthalic acid, citric acid and succinic acid, citric acid and glutaric acid, citric acid and adipic acid, citric acid and lactic acid, citric acid and fumaric acid, citric acid and phthalic acid, malic acid and succinic acid, malic acid and glutaric acid, malic acid and adipic acid, malic acid and lactic acid, malic acid and fumaric acid, malic acid and phthalic acid, glycolic acid and succinic acid, glycolic acid and glutaric acid, glycolic acid and adipic acid, glycolic acid and lactic acid, glycolic acid and fumaric acid, glycolic acid and phthalic acid, tartaric acid and succinic acid, tartaric acid and glutaric acid, tartaric acid and adipic acid, tartaric acid and lactic acid, tartaric acid and fumaric acid and tartaric acid and phthalic acid. From these combinations, either one combination or two or more combinations may be selected.

Among the above combinations of the A-group and the B-group, a combination of malonic acid and succinic acid, citric acid and succinic acid, malic acid and succinic acid, glycolic acid and succinic acid or tartaric acid and succinic acid is especially preferable.

The ratio by weight of the compound A to the compound B contained in the metal oxide dissolver (ii) is preferably 5:1 to 1:10, more preferably 2:1 to 1:3 and particularly preferably 1:1 to 1:2 though it may be a desirable value insofar as the effect of the present invention is not impaired.

Examples of the aromatic compound having a triazole skeleton among the C-group may include benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazolemethylester, 4-carboxyl(-1H-)benzotriazolebutylester, 4-carboxyl(-1H-)benzotriazoleoctylester, 5-hexylbenzotriazole, [1,2,3-benzotriazolyl-1-methyl][1,2,4-triazolyl-1-methyl][2-eth ylhexyl]amine, tolyltriazole, naphthotriazole, bis [(1-benzotriazolyl)methyl]phosphonic acid and 5-methylbenzotriazole. Among these compounds, the C-group is preferably benzotriazole, 1-hydroxybenzotriazole and 5-methylbenzotriazole in view of polishing rate and etching rate. As the metal inhibitor, either one type or a combination of two or more types is selected from these compounds of the C-group.

Examples of the aliphatic compounds having a triazole skeleton among the D-group include 1,2,3-triazole, 1,2,4-triazole, 3-amino-1H-1,2,4-triazole, 3-aminotriazole and 4-amino-4H-1,2,4-triazole. Among these compounds, it is preferable to be selected from 1,2,3-triazole, 1,2,4-triazole, 3-amino-1H-1,2,4-triazole and 4-amino-4H-1,2,4-triazole in the point of polishing rate and etching rate. From these compounds, a single one or a combination of two or more may be selected.

Examples of the compound having an imidazole skeleton may include 2-methylimidazole, 2-ethylimidazole, 2-(isopropyl)imidazole, 2-propylimidazole, 2-butylimidazole, 4-methylimidazole, 2,4-dimethylimidazole, 2-ethyl-4-methylimidazole, 2-undecylimidazole and 2-aminoimidazole. Among these compounds, it is preferable to be selected from 2-methylimidazole, 2-ethylimidazole, 2-(isopropyl)imidazole, 2-propylimidazole, 2-butylimidazole, 4-methylimidazole, 2,4-dimethylimidazole and 2-ethyl-4-methylimidazole in view of polishing rate and etching rate. From these compounds, a single one or a combination of two or more may be selected.

Examples of the compound having a pyrimidine skeleton include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trion, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidopyrimidine, 2-aminopyrimidine, 2-methyl-5,7-diphenyl-(1,2,4)triazolo(1,5-a)pyrimidine, 2-methylsulfanyl-5,7-diphenyl-(1,2,4)triazolo(1,5-a)pyrimidine, 2-methylsulfanyl-5,7-diphenyl-4,7-dihydro-(1,2,4)triazolo(1,5-a)pyrimidine and 4-aminopyrazolo[3,4-d]pyrimidine. Particularly, the compound is preferably selected from 4-aminopyrazolo[3,4-d]pyrimidine, 1,2,4-triazolo[1,5-a]pyrimidine, 2-methyl-5,7-diphenyl-(1,2,4)triazolo(1,5-a)pyrimidine and 2-methylsulfanyl-5,7-diphenyl-(1,2,4)triazolo(1,5-a)pyrimidine from the viewpoint of polishing rate and etching rate. From these compounds, a single one or a combination of two or more maybe selected.

Examples of the compound having a guanidine skeleton may include 1,3-diphenylguanidine and 1-methyl-3-nitroguanidine. Examples of the compound having a thiazole skeleton may include 2-mercaptobenzothiazole. From these compounds, a single one or a combination of two or more may be selected.

As the metal inhibitor as the D-group, a single one or a combination of two or more may be selected from the foregoing compounds.

The ratio by weight of the compound selected from the C-group to the compound selected from the D-group is preferably 10:1 to 1:10, more preferably 5:1 to 1:7.5 and particularly preferably 3:1 to 1:6 though it may be a desired value insofar as the effect of the present invention is not impaired.

The pH of the polishing slurry must be 2 to 5, preferably 3 to 4.5 and still more preferably 3.5 to 4.3. When the pH is less than 2, this easily gives rise to problems such as metal corrosions and surface roughing. The concentration of the metal inhibitor is raised to reduce the foregoing metal corrosion and surface roughness whereby the coefficient of polishing friction is increased and wiring inferiors are easily caused. Also, if the pH exceeds 5, the metal corrosive effect is reduced and it is therefore possible to decrease the concentration of the metal inhibitor. However, it is difficult to obtain a sufficient polishing rate.

The pH of the polishing slurry of the present invention can be controlled by the amount of an acid to be added. The pH may also be controlled by adding an alkali component such as ammonia, sodium hydroxide or tetramethylammonium hydroxide (TMAH).

The pH of the polishing slurry of the present invention was measured by a pH meter (for example, model PH81 manufactured by Yokogawa Electric Corporation). A standard buffer solution (phthalate pH buffer solution pH:4.21 (25° C.)) and a neutral phosphate pH buffer solution (pH: 6.86 (25° C.)) were used to make two-point calibration and then an electrode was immersed in the polishing slurry to measure the pH of the slurry stabilized after two minutes or more passed.

The polishing slurry of the present invention may contain a water-soluble polymer to make an improvement in dishing and erosion of metal wiring. No particular limitation is imposed on the material to be used as the water-soluble polymer and the water-soluble polymer preferably has a weight average molecular weight of 500 or more. Examples of the water-soluble polymer include:

polysaccharides such as alginic acid, pectic acid, carboxymethyl cellulose, agar, cardlan and pullulan;

polycarboxylic acids such as a polyaspartic acid, polyglutamic acid, polylycine, polymalic acid, polymethacrylic acid, polyamic acid, polymaleic acid, polyitaconic acid, polyfumaric acid, poly(p-styrenecarboxylic acid), polyacrylic acid, polyamic acid, and polyglyoxylic acid:

salts, esters and derivatives of polycarboxylic acids exemplified by a polyacrylamide, amino polyacrylamide, ammonium polyacrylate, sodium polyacrylate, ammonium polymethacrylate, sodium polymethacrylate, ammonium polyamidate and sodium polyamidate;

vinyl type polymers such as a polyvinyl alcohol, polyvinyl pyrrolidone and polyacrole in; and their esters and ammonium salts.

Among these compounds, polysaccharides, polycarboxylic acids, esters of polycarboxylic acids, salts of polycarboxylic acids, polyacrylamides and vinyl type polymers are preferable. Specifically, pectic acid, agar, polymalic acid, polymethacrylic acid, polyacrylic acid, polyacrylamide, polyvinyl alcohol and polyvinyl pyrrolidone, and esters of these compounds and ammonium salts of these compounds are preferable.

When the base body to which the present invention is applied is a silicon substrate for semiconductor integrated circuit, contamination with alkali metals, alkali earth metals, halides and the like is undesirable. Therefore, in the case of salts, ammonium salts are desirable. This need not apply to the case where the base body is a glass substrate.

The amount of the oxidant to be added in the present invention is designed to be preferably 0.01 to 50 g, more preferably 0.1 to 30 g and particularly preferably 0.2 to 15 g based on the polishing slurry of 100 g in gross weight. When the amount to be compounded is less than 0.01 g, metals are insufficiently oxidized and the CMP rate therefore tends to be lower. When the amount exceeds 50 g, on the other hand, a thick oxide film layer is formed on the surface of a metal and the polishing rate therefore tends to be dropped.

The amount of the metal oxide dissolver component to be added in the present invention is designed to be preferably 0.001 to 10 g, more preferably 0.01 to 1 g and particularly preferably 0.01 to 0.5 g based on the polishing slurry of 100 g in gross weight. When the amount is less than 0.001 g, the polishing rate tends to be reduced whereas when the polishing rate exceeds 10 g, the etching rate is increased, posing a problem concerning corrosion of metal wiring. If the amount of the metal inhibitor is increased to suppress etching rate, there is a tendency that polishing friction is increased.

The amount of the metal inhibitor to be added in the present invention is designed to be preferably 0.001 to 2.0 g based on the polishing slurry of 100 g in gross weight. Namely, the amount is preferably 0.001 to 2.0% by weight, more preferably 0.01 to 0.50% by weight and still more preferably 0.02 to 0.15% by weight based on the total weight of the polishing slurry. When the amount to be compounded is less than 0.001% by weight, there is a tendency that it is difficult to suppress etching whereas the amount exceeds 2.0% by weight, there is a tendency that a practical level of polishing rate is not obtained.

When the water-soluble polymer is compounded in the polishing slurry of the present invention, the amount of the water-soluble polymer to be compounded is preferably 0.001 to 10 g, more preferably 0.01 to 2 g and particularly preferably 0.1 to 1 g based on the polishing slurry of 100 g in gross weight. When the amount to be compounded is less than 0.001 g, there is a tendency that metal wiring is deteriorated in dishing and the accumulation of polished materials on a polishing cloth is increased whereas when the amount exceeds 10 g, there is a tendency that the etching rate is increased and it is difficult to accomplish the compatibility between the polishing rate and the uniformity of polishing in the surface.

The weight average molecular weight of the water-soluble polymer is preferably 500 or more, more preferably 5,000 or more and particularly preferably 10,000 or more. Although there is no limitation to the upper limit of the weight average molecular weight, the upper limit is 5,000,000 or less from the viewpoint of solubility. When the weight average molecular weight is less than 500, there is a tendency that a high polishing rate is not exhibited. In the present invention, it is preferable to use at least one or more water-soluble polymers having a weight average molecular weight of 500 or more.

The polishing slurry of the present invention may be compounded of abrasive such as alumina, silica and ceria, surfactants and colorants including dyes such as Victoria Pure Blue and pigments such as Phthalocyanine Green.

Also, the polishing slurry of the present invention may be compounded of an organic solvent. The organic solvent is preferably mixed with water in an optional ratio. Examples of the organic solvent include methanol, ethanol, 2-propanol, tetrahydrofuran, ethylene glycol, acetone and methyl ethyl ketone.

As the abrasive, any of inorganic abrasive such as silica, alumina, zirconia, ceria, titania and silicon carbide and organic abrasive such as a polystyrene, polyacryl and polyvinyl chloride may be used. However, one or more solid abrasive selected from alumina, silica and ceria are preferable. Moreover, as the abrasive, colloidal silica and colloidal alumina having an average particle diameter of 100 nm or less are preferable because they have high dispersing stability and are reduced in the number of scratches to be generated by CMP. Colloidal silica and colloidal alumina having an average particle diameter of 80 nm or less are more preferable and colloidal silica having an average particle diameter of 60 nm or less is most preferable. As to colloidal silica, a production method using hydrolysis of silicon alkoxide or ion exchange of sodium silicate is known, and as to colloidal alumina, a production method using hydrolysis of aluminum nitrate is known.

The particle diameter of the abrasive used in the present invention was measured by a photo-diffraction diffusion type grain distribution measuring meter (for example, model number: COULTER N4SD manufactured by COULTER Electronics). Also, the degree of coagulation of particles was measured by a transmission type electron microscope (for example, Model No. H-7100FA, manufactured by Hitachi, Ltd.).

The measurement condition of the grain distribution measuring meter (COULTER) was as follows: measuring temperature: 20° C., diffraction of a solvent: 1.333 (water), diffraction of particles: unknown (set), viscosity of a solvent: 1.005 cp (water), Run Time: 200 seconds, incident angle of laser: 90°, and intensity (scattering intensity, corresponding to turbidity) was designed to be in a range from 5E+04 to 4E+05, wherein, in the case where the intensity was higher than 4E+05, the sample was diluted with water to measure.

When the abrasive is compounded, the concentration of the abrasive is preferably 0.01 to 10.0% by weight, more preferably 0.05 to 2.0% by weight and most preferably 0.1 to 1.0% by weight. This is because the effect obtained by addition of the abrasive is unsatisfactory when the concentration of the abrasive is less than 0.01% by weight whereas a difference in effect is unobserved when the abrasive is added in an amount of 10.0% by weight or more.

The first polishing method of the present invention comprises polishing the surface of a base body to be polished by moving a polishing cloth and the base body relatively under the condition that the surface to be polished is pressed against the polishing cloth with supplying any one of the above polishing slurries of the present invention to the surface of the polishing cloth on a polishing table. As the base body, a substrate in a process of manufacturing a semiconductor device is preferably used. For instance, it is preferable to polish a substrate during a process of forming a wiring layer in a semiconductor device.

Specifically, the second polishing method of the present invention comprises a step (hereinafter referred to as a first polishing step) of polishing a metal layer of a substrate provided with an interlayer dielectric film whose surface is constituted of concave portions and convex portions, a barrier layer which covers the interlayer dielectric film along the surface thereof and the metal layer with which the concave portions are filled and which covers the barrier layer, to expose the barrier layer on the convex portions, and a step (hereinafter referred to as a second polishing step) of polishing at least the barrier layer and the metal layer in the concave portions to expose the interlayer dielectric film on the convex portions after the first polishing step, wherein the polishing slurry of the present invention is used to polish in at least one of the first and second polishing steps.

Here, a proper choice of, for example, polishing conditions and the composition of the polishing slurry makes it possible to polish using the polishing slurry also in the second polishing step in succession to the first polishing step.

Examples of the dielectric film of the interlayer dielectric film include a silicon type film and an organic polymer film. Examples of the silicon type film include silicon dioxide, fluorosilicate glass, organosilicate glass obtained from trimethylsilane or dimethoxydimethylsilane as starting material, silicon oxynitride, silica type film such as hydrogenated silsesquioxane, silicon carbide and silicon nitride. Examples of the organic polymer film include whole aromatic low dielectric interlayer dielectric films. Particularly, organosilicate glass is preferable. These films are formed by a CVD method, spin coating method, dip coating method or spraying method.

The barrier layer is formed with the intention of preventing the diffusion of metals such as copper into an interlayer dielectric film and improving the adhesion of the dielectric film to a metal. The barrier layer is preferably constituted of at least one type selected from tantalum, tantalum nitride, a tantalum alloy, other tantalum compounds, titanium, titanium nitride, a titanium alloy, other titanium compounds, tungsten, tungsten nitride, a tungsten alloy and other tungsten compounds. The barrier layer preferably has either a monolayer structure comprising one composition or a laminate structure comprising two or more compositions.

Examples of the metal layer include layers including, as a major component, metals such as copper, a copper alloy, copper oxide, oxide of a copper alloy, tungsten, a tungsten alloy, silver or gold. It is preferable to polish a layer containing at least one type selected from copper, a copper alloy, a copper oxide and an oxide of a copper alloy among these materials. The metal layer may be formed on the barrier layer by a known sputtering method or plating method. In the case of polishing using, for example, a polishing cloth, a general polisher having a holder supporting a semiconductor substrate and a polishing table to which the polishing cloth (polishing pad) is applied and which is equipped with, for example, a motor variable in rotation may be used as a polisher.

As the polishing cloth on the polishing table, usual nonwoven fabric, foamed polyurethane, porous fluororesin or the like may be used and no particular limitation is imposed on the polishing cloth. Also, it is preferable to form grooves on the polishing cloth to trap the polishing slurry. Although no particular limitation is imposed on the polishing condition, the rotating speed of the table is preferably as low as 200 rpm or less so as to prevent the substrate from running away. The pressure (processing pressure) under which the semiconductor substrate having the surface to be polished is pressed against the polishing cloth is preferably 1 kPa to 100 kPa, and more preferably 5 kPa to 50 kPa to meet the requirements as to the uniformity of polishing speed in the wafer surface and the flatness of a pattern. During polishing, the polishing slurry of the present invention is supplied continuously to the polishing cloth by a pump. Although no particular limitation is imposed on the amount of the polishing slurry to be supplied, it is preferable to cover the surface of the polishing cloth always with the polishing slurry.

Specifically, the surface to be polished can be polished by moving the polishing cloth and the substrate relatively under the condition that the surface of the substrate to be polished is pressed against the polishing cloth with supplying the polishing slurry to the surface of the polishing cloth on the polishing table. In order to move the polishing cloth and the substrate relatively, the polishing table may be rotated and also, the holder may be rotated or fluctuated for polishing. Also, a polishing method in which the polishing table is rotated epicyclically and a polishing method in which a belt-like polishing cloth is moved linearly in one longitudinal direction are exemplified.

In this case, the holder may be placed in any of a fixed state, rotated state and fluctuated state. An appropriate polishing method may be selected from these polishing methods according to the type of the surface to be polished and the type of polisher insofar as the polishing cloth and the substrate are relatively moved.

The semiconductor substrate after the polishing is finished is preferably washed thoroughly in flowing water and then dried by a spin drier or the like after sweeping out water droplets stuck to the surface of the semiconductor substrate.

Explanations will be furnished as to an embodiment of the polishing method of the present invention according to the process of the formation of a wiring layer in a semiconductor device.

First, an interlayer dielectric film of silicon dioxide or the like is laminated on a silicon substrate. Then, a concave portion (substrate exposed portion) with a specified pattern is formed on the surface of the interlayer dielectric film by known measures such as forming a resist layer and etching, to make an interlayer dielectric film consisting of the convex portions and the concave portions. On this interlayer dielectric film, a barrier layer of tantalum or the like which layer covers the interlayer dielectric film along the surface irregularities is formed by vapor deposition, CVD or the like. Further, a metal layer of copper or the like for covering the barrier layer is formed by vapor deposition, plating or CVD such that the above concave portion is filled with the metal layer. The thicknesses of the interlayer dielectric film, barrier layer and metal layer are preferably about 0.01 to 2.0 µm, about 1 to 100 nm and about 0.01 to 2.5 µm respectively.

(First Polishing Step)

Next, this semiconductor substrate is secured to an polisher to polish the surface metal layer which is the surface to be polished while supplying the polishing slurry of the present invention. A desired conductive pattern is thereby obtained in which the barrier layer on the convex portion of the interlayer dielectric film is exposed from the surface of the substrate and the above metal layer is left in the concave portion of the interlayer dielectric film.

(Second Polishing Step)

Then, the aforementioned conductive pattern or at least the aforementioned exposed barrier layer and the metal layer in the concave portion as the surface to be polished is polished with supplying the polishing slurry of the present invention. The polishing is terminated when a desired pattern is obtained in which all the interlayer dielectric film beneath the barrier layer of the convex portion is exposed, the aforementioned metal layer to be a wiring layer is left in the concave portion and the section of the barrier layer is exposed at the boundary between the convex portion and the concave portion. The substrate may be further polished (over-polishing: in the case where the time required to obtain a desired pattern in the second polishing step is, for example, 100 seconds, additional polishing made for 50 seconds in addition to the polishing for 100 seconds is called 50% over polishing) to the depth extended to a part of the interlayer dielectric film of the convex portion.

In the second polishing step, examples of the polishing method include a method in which a metal or resin brush is brought into contact with the surface to be polished and a method in which a polishing slurry is sprayed on the surface to be polished under a specified pressure besides a polishing method in which the surface to be polished is polished by moving the polishing cloth and the substrate relatively under the condition that the surface of the substrate to be polished is pressed against the polishing cloth in the same manner as in the first polishing method of the present invention.

If the polishing slurry of the present invention is used to polish in at least one of these first polishing step and second polishing step, a merit that the amount of dishing is small is obtained because the effects of the metal oxide dissolver and metal inhibitor in the polishing slurry are well balanced with each other and also, the polishing rate of the surface to be polished is incresed and the etching rate is decreased without raising the coefficient of polishing friction. When polishing, for instance, copper, the etching rate is preferably 3 nm/min. or less, more preferably 2 nm/min. or less and particularly preferably 1.5 nm/min. or less. Also, the coefficient of polishing friction is preferably 0.7 or less and more preferably 0.4 or less.

The polishing slurry of the present invention may be used to polish in both the first and second polishing steps. In this case, it is necessary to carry out neither a step of washing the polished surface nor a step of drying the surface during the course between the first step and the second step. However, the operation may be suspended to exchange the polishing table and polishing cloth or to change processing loads and the like. The polishing slurries of the present invention which are used in the first and second polishing steps may have either the same compositions or different compositions. However, if the same compositions are used in the first and second steps, it is possible to polish continuously from the first polishing step to the second polishing step without being suspended and therefore high productivity is obtained.

An interlayer dielectric film and a second layer metal wiring are further formed on the metal wiring formed in this manner and then an interlayer dielectric film is formed between the wires and on the wires, followed by polishing to make a flat surface over the entire surface of the semiconductor substrate. This process is repeated predetermined times, whereby a semiconductor device having a desired number of wiring layers can be manufactured.

EXAMPLES

The present invention will be explained by way of examples, which, however, are not intended to be limiting of the present invention.

(Preparation of a Polishing Slurry)

Examples 1 to 6 and Comparative Examples 1 to 6

25% by weight of aqueous hydrogen peroxide (extra pure reagent, aqueous 30% solution) as the oxidant (i), an acid having the composition shown in Tables 1 and 2 as the metal oxide dissolver (ii), benzotriazole (BTA) in the amount shown in Tables 1 and 2 as the metal inhibitor (iii), 0.4% by weight of a water-soluble polymer having a weight average molecular weight of 20,000 and 0.2% by weight of colloidal silica abrasive having an average particle diameter of 60 nm were blended, which was balanced by pure water to be a total of 100% by weight, thereby preparing polishing slurries of Examples 1 to 6 and Comparative Examples 1 to 6 wherein each weight was based on the weight of the polishing slurry. The pH of the polishing slurry was adjusted to the value shown in Tables 1 and 2 by adding aqueous ammonia (25%) after the pure water was blended.

Examples 7 and 8 and Comparative Examples 7 and 8

25% by weight of aqueous hydrogen peroxide (extra pure reagent, aqueous 30% solution) as the oxidant (i), each composition shown in Table 3 as the metal oxide dissolver (ii) and as the metal inhibitor (iii), 0.4% by weight of a water-soluble polymer having a weight average molecular weight of 20,000 and 0.2% by weight of colloidal silica abrasive having an average particle diameter of 60 nm were blended, which was balanced by pure water to be a total of 100% by weight, thereby preparing polishing slurries of Examples 7 and 8 and Comparative Examples 7 and 8 wherein each weight was based on the weight of the polishing slurry. The pH of the polishing slurry was adjusted to the value shown in Table 3 by adding aqueous ammonia (25%) after the pure water was blended. In the tables, % means % by weight.

TABLE 1

| No. | Metal oxide dissolver A-group (%) | Metal oxide dissolver B-group (%) | Metal inhibitor (BTA) (%) | pH | Etching rate (nm/min) | Polishing rate (nm/min) | Dishing (nm) | Coefficient of polishing friction |
|---|---|---|---|---|---|---|---|---|
| Example 1 | malonic acid 0.05 | phthalic acid 0.1 | 0.10 | 3.5 | 2.1 | 400 | 160 | 0.45 |
| Example 2 | malic acid 0.05 | adipic acid 0.1 | 0.05 | 4.0 | 1.6 | 280 | 130 | 0.31 |
| Example 3 | glycolic acid 0.05 | glutaric acid 0.1 | 0.08 | 3.0 | 1.5 | 320 | 160 | 0.37 |
| Example 4 | glycolic acid 0.05 | glutaric acid 0.1 | 0.05 | 3.5 | 1.2 | 300 | 130 | 0.28 |
| Example 5 | tartaric acid 0.075 | fumaric acid 0.075 | 0.15 | 3.5 | 1.9 | 310 | 160 | 0.59 |
| Example 6 | malic acid 0.075 | succinic acid 0.075 | 0.125 | 3.5 | 1.5 | 310 | 140 | 0.49 |

TABLE 2

| No. | Metal oxide dissolver A-group (%) | Metal oxide dissolver B-group (%) | Metal inhibitor (BTA) (%) | pH | Etching rate (nm/min) | Polishing rate (nm/min) | Dishing (nm) | Coefficient of polishing friction |
|---|---|---|---|---|---|---|---|---|
| Comparative Example 1 | malic acid 0.20 | — | 0.25 | 3.5 | 1.8 | 260 | 250 | 0.72 |
| Comparative Example 2 | malic acid 0.20 | — | 0.1 | 3.5 | 4~5 | 300 | 180 | 0.45 |
| Comparative Example 3 | malonic acid 0.10 malic acid 0.05 | — | 0.35 | 3.0 | 2.5 | 400 | 320 | 1.0 |
| Comparative Example 4 | malonic acid 0.10 malic acid 0.05 | — | 0.1 | 3.5 | 6.5 | 450 | 220 | 0.45 |
| Comparative Example 5 | — | adipic acid 0.15 | 0.02 | 3.5 | 0.4 | 180 | 150 | 0.15 |
| Comparative Example 6 | — | adipic acid 0.3 | 0.02 | 3.5 | 2.5 | 250 | 180 | 0.15 |

TABLE 3

| No. | Metal oxide dissolver (%) | Metal inhibitor C-group (%) | Metal inhibitor D-group (%) | pH | Etching rate (nm/min) | Polishing rate (nm/min) | Dishing (nm) | Coefficient of polishing friction |
|---|---|---|---|---|---|---|---|---|
| Example 7 | malic acid 0.15 | benzotriazole 0.05 | 1,2,4-triazol 0.02 | 3.5 | 2.0 | 350 | 140 | 0.29 |
| Example 8 | glycolic acid 0.15 | benzotriazole 0.02 | 3-animo-1H-1,2,4-triazol 0.05 | 3.5 | 1.6 | 320 | 150 | 0.34 |
| Comparative Example 7 | malic acid 0.15 | benzotriazole 0.2 | — | 3.5 | 1.8 | 280 | 250 | 0.7 |
| Comparative Example 8 | glycolic acid 0.15 | benzotriazole 0.02 | — | 3.5 | 6.5 | 350 | 210 | 0.15 |

(Base Body)
(1) A 5" (12.7 cm) silicon substrate with no pattern: Silicon substrate/silicon dioxide film (thickness: 300 nm)/barrier layer: tantalum nitride film (thickness: 25 nm)/copper film (thickness: 1.2 μm); and
(2) A 5" (12.7 cm) silicon substrate with a pattern: Silicon substrate formed with a 0.5-μm-deep groove/silicon dioxide film (thickness: 300 nm)/barrier layer: tantalum nitride film (thickness: 25 nm)/copper film (thickness: 1.2 μm) were prepared.

(Polishing Condition)
Amount of the polishing slurry to be supplied: 500 cc/min.
Polisher: Dead weight type experimental polisher (diameter of the polishing table: φ40 cm)
Polishing cloth: foam polyurethane resin (model No. IC1000, manufactured by Rodel Company)
Polishing pressure: 21 kPa
Relative speed between the base body and the polishing table: 36 m/min, rotation of the table: 60 rpm (Evaluation Items of the Polishing Slurry)
Etching rate: the above two types of base body were dipped in the stirred above polishing slurries (ambient temperature, 25° C. and stirring speed: 100 rpm) to find a difference between the film thicknesses of the copper layer before and after the dipping by converting from each resistance. Almost the same values were obtained from the two types of base body and the value of the base body with no pattern was adopted.

Polishing rate of copper by CMP: the above two types of base body were polished in the above polishing condition with supplying each polishing slurry prepared above to the surface of the polishing cloth. A difference between the thicknesses of the copper film before and after the polishing was calculated by converting from each resistance. Almost the same values were obtained from the two types of base body and the value of the base body with no pattern was adopted.

Amount of dishing: as the base body, a silicone substrate was prepared in which a 0.5-μm-deep groove was formed at a wiring density of 50% in a wiring width of 0.35 to 100 μm, next, a 300-nm-thick silicon dioxide film was formed by a known plasma CVD method, then a 50-nm-thick tantalum nitride film was formed as a barrier layer by a known sputtering method and further a1.2-μm-thick copper film was likewise formed by a sputtering method and embedded by a known heat treatment.

The copper film was polished in the same condition as in the above evaluation of polishing rate until the tantalum nitride barrier layer was exposed from the entire surface of the substrate. Next, a tracer type level meter was used to find a decrease in the film thickness of the wiring metal portion for the dielectric film from the surface shape of a stripe pattern portion where 100-μm-wide wiring metal parts and 100-μm-wide dielectric film parts were alternately arranged.

Figure 2:
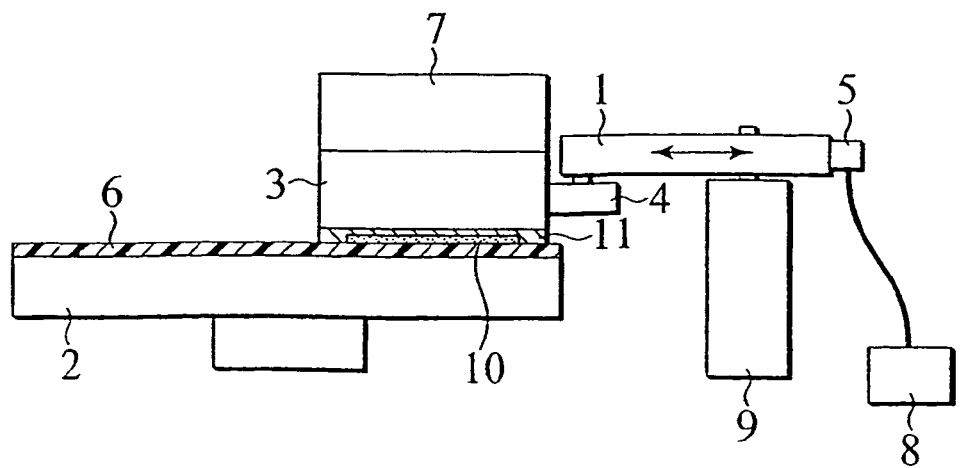
FIG. 2 is a sectional typical view of one example of the condition that a wafer is polished in the wafer polisher shown in FIG. 1, wherein 6 represents a polishing cloth, 7 represents a weight, 8 represents a pressure gauge, 9 represents a carrier holder column, 10 represents a wafer and 11 represents a backing film with a guide ring.

Coefficient of polishing friction: FIG. 1 is a top plan view typically showing one example of a wafer polisher equipped with a movable carrier holder. FIG. 2 is a sectional typical view of one example of the condition that a wafer is polished in the wafer polisher shown in FIG. 1.

A polisher for a 12.7 cm (5") wafer equipped with a movable carrier holder device 1 as shown in these figures was prepared. The carrier holder device 1 is supported by a carrier holder column 9. An polishing cloth 6 is applied to the upper side of a polishing table 2 of the polisher. The polishing pressure is controlled by a weight 7. Also, the polishing slurry is supplied to the surface of the polishing cloth from a polishing slurry-supply unit (not shown).

Among the above base bodies, a wafer 10 with no pattern was secured to the lower part of a carrier 3 of the carrier holder device 1 by a backing film 11 with a guide ring such that the surface to be polished faced the polishing cloth. The polishing of the Cu film was started in the same condition as in the above evaluation of polishing rate. After two minutes, the force applied to a piezoelectric element 5 through a roller 4 of the carrier holder device 1 was read as electric signals by a load converter (model No. LM-50KA) manufactured by (K.K.) Kyowa Dengyo and the data was converted into friction force by a pressure output meter to calculate the coefficient of polishing friction.

The etching rate, the polishing rate of copper by CMP, the amount of dishing and the coefficient of polishing friction in Examples 1 to 8 and Comparative Examples 1 to 8 are described together in the Table 1 to Table 3.

In Comparative Example 1, only an A-group organic acid having a relatively small pKa is independently used as the metal oxide dissolver. Because the concentration of benzotriazole which is the metal inhibitor is made high to suppress etching rate, the amount of dishing is increased and also the polishing friction is increased. In Comparative Example 3, the concentration of the inhibitor is likewise high, the amount of dishing is large and polishing friction is large since two types of the A-group acid having pKa less than 3.7 are used. In Comparative Examples 2 and 4 limited in the amount of the metal inhibitor, the etching rate is not dropped to a value falling in a proper range. In Comparative Examples 5 and 6, only a B-group organic acid having a relatively large pKa is independently used and therefore the concentration of the inhibitor is low and the polishing friction is also low. However, satisfactory polishing rate is not obtained even if the concentration of the organic acid is increased. In Examples 1 to 6, on the contrary, etching is suppressed even when the concentration of the inhibitor is relatively low, is reduced in polishing friction and good dishing characteristics are obtained.

In Comparative Examples 7 and 8, only a C-group benzotriazole is used as the metal inhibitor. In Comparative Example 7, the concentration of the metal inhibitor is raised to suppress the etching rate to a value falling in a practical range, with the result that the amount of dishing is large and the coefficient of polishing friction is also large. In Comparative Example 8 limited in the concentration of the metal inhibitor, the etching rate is high and the amount of dishing is not decreased to a value falling in a proper range, though the coefficient of polishing friction is small. In Examples 7 and 8 on the contrary, etching is suppressed when the concentration of the metal inhibitor is relative low, the coefficient of polishing friction is small and good dishing characteristics are obtained.

INDUSTRIAL APPLICABILITY

The invention provides a polishing slurry which has a high metal-polishing rate and reduced etching rate, and the both are well balanced with each other, therefore reduces polishing friction when the concentration of the metal inhibitor is low, results high productivity and reduces dishing and erosion in metal wiring. The polishing method using the polishing slurry of the present invention is preferably used in a process of manufacturing semiconductor devices and various electronic parts and devices which are expected to be miniaturized, thin-filmed, improved in dimensional accuracy, electric characteristics and productivity and are highly reliable.

The invention claimed is:

1. A polishing slurry comprising (i) an oxidant, (ii) a metal oxide dissolver, (iii) a metal inhibitor and water and having a pH from 2 to 5, wherein;

the metal oxide dissolver (ii) contains one or more compounds selected from one or more acids (A-group) selected from acids of which the negative value of the logarithm of the dissociation constant ka (pKa) of a first dissociable acid group is less than 3.7 and from which lactic acid, phthalic acid, fumaric acid, maleic acid and aminoacetic acid are excluded, ammonium salts of the A-group acids and esters of the A-group acids, and one or more compounds selected from one or more acids (B-group) selected from acids of which the negative value of the logarithm of the dissociation constant ka (pKa) of a first dissociable acid group is 3.7 or more, lactic acid, phthalic acid, fumaric acid, maleic acid and aminoacetic acid, ammonium salts of the B-group acids and esters of the B-group acids.

2. A polishing slurry comprising (i) an oxidant, (ii) a metal oxide dissolver, (iii) a metal inhibitor and water and having a pH from 2 to 5, wherein;

the metal inhibitor (iii) contains one or more types selected from the group (C-group) consisting of aromatic compounds having a triazole skeleton and one or more types selected from the group (D-group) consisting of aliphatic compounds having a triazole skeleton, compounds having a pyrimidine skeleton, compounds having an imidazole skeleton, compounds having a guanidine skeleton, compounds having a thiazole skeleton and compounds having a pyrazole skeleton.

3. A polishing slurry according to claim 1, wherein the A-group consists of malonic acid, citric acid, malic acid, glycolic acid, glutamic acid, oxalic acid, tartaric acid, picolinic acid, nicotinic acid, mandelic acid, sulfuric acid, nitric acid, phosphoric acid, hydrochloric acid and formic acid and the B-group consists of succinic acid, adipic acid, glutaric acid, benzoic acid, quinaldinic acid, butyric acid, valeric acid, lactic acid, phthalic acid, fumaric acid, maleic acid, gluconic acid, acetic acid and aminoacetic acid.

4. A polishing slurry according to claim 1 or 2, wherein the metal oxide dissolver (ii) includes either a combination of acids selected from the following combinations of acids or a combination in which at least one of the combination selected from the following combinations of acids is an ammonium salt of an acid:

malonic acid and succinic acid, malonic acid and glutaric acid, malonic acid and adipic acid, malonic acid and lactic acid, malonic acid and fumaric acid, malonic acid and phthalic acid, citric acid and succinic acid, citric acid and glutaric acid, citric acid and adipic acid, citric acid and lactic acid, citric acid and fumaric acid, citric acid and phthalic acid, malic acid and succinic acid, malic acid and glutaric acid, malic acid and adipic acid, malic acid and lactic acid, malic acid and fumaric acid, malic acid and phthalic acid, glycolic acid and succinic acid, glycolic acid and glutaric acid, glycolic acid and adipic acid, glycolic acid and lactic acid, glycolic acid and fumaric acid, glycolic acid and phthalic acid, tartaric acid and succinic acid, tartaric acid and glutaric acid, tartaric acid and adipic acid, tartaric acid and lactic acid, tartaric acid and fumaric acid and tartaric acid and phthalic acid.

5. A polishing slurry according to claim 1, wherein the metal inhibitor (iii) contains one or more types selected from compounds having a triazole skeleton, compounds having a pyrimidine skeleton, compounds having an imidazole skeleton, compounds having a guanidine skeleton, compounds having a thiazole skeleton and compounds having a pyrazole skeleton.

6. A polishing slurry according to claim 2, wherein said C-group is at least one type selected from benzotriazole, 1-hydroxybenzotriazole and 5-methylbenzotriazole.

7. A polishing slurry according to claim 2 or 6, wherein said aliphatic compound having a triazole skeleton of the D-group is at least one type selected from 1,2,3-triazole, 1,2,4-triazole, 3-amino-1H-1,2,4-triazole and 4-amino-4H-1,2,4-triazole.

8. A polishing slurry according to claim 2, wherein said compound having a pyrimidine skeleton is at least one type selected from 4-aminopyrazolo[3,4-d]pyrimidine, 1,2,4-triazolo[1,5-a]pyrimidine, 2-methyl-5,7-diphenyl-(1,2,4)triazolo(1,5-a)pyrimidine and 2-methylsulfanyl-5,7-diphenyl-(1,2,4)triazolo(1,5-a)pyrimidine.

9. A polishing slurry according to of claim 2, wherein said compound having an imidazole skeleton is at least one type selected from 2-methylimidazole, 2-ethylimidazole, 2-(isopropyl)imidazole, 2-propylimidazole, 2-butylimidazole, 4-methylimidazole, 2,4-dimethylimidazole and 2-ethyl-4-methylimidazole.

10. A polishing slurry according to claim 2, wherein said compound having a guanidine skeleton is at least one type selected from 1,3-diphenylguanidine and 1-methyl-3-nitroguanidine.

11. A polishing slurry according to claim 1 or 2, wherein the pH is 3 to 4.5 and the concentration of the metal inhibitor in the polishing slurry is 0.01 to 0.50% by weight.

12. A polishing slurry according to claim 1 or 2, wherein the metal oxide (i) is at least one type selected from hydrogen peroxide, ammonium persulfate, ferric nitrate, nitric acid, potassium periodate, hypochlorous acid and ozone water.

13. A polishing slurry according to claim 1 or 2, the slurry comprising at least one water-soluble polymer having a weight average molecular weight of 500 or more.

14. A polishing slurry according to claim 13, wherein the water-soluble polymer having a weight average molecular weight of 500 or more is at least one type selected from polysaccharides, polycarboxylic acids, esters of polycarboxylic acids, salts of polycarboxylic acids, polyacrylamides and vinyl type polymers.

15. A polishing slurry according to claim 1 or 2, the slurry comprising one or more solid abrasive types selected from alumina, silica and ceria.

16. A polishing method comprising polishing the surface to be polished of a base body by moving a polishing cloth and the base body relatively under the condition that the surface to be polished is pressed against the polishing cloth with supplying any one of the polishing slurries as claimed in claim 1 or 2 to the surface of the polishing cloth on a polishing table.

17. A polishing method comprising a first polishing step of polishing a metal layer of a substrate provided with an interlayer dielectric film whose surface is constituted of concave portions and convex portions, a barrier layer which covers said interlayer dielectric film along the surface thereof and the metal layer with which said concave portions are filled and which covers the barrier layer, to expose the barrier layer on said convex portions, and a second polishing step of polishing at least the barrier layer and the metal layer in the concave portions to expose the interlayer dielectric film on the convex portions after the first polishing step, wherein any one of the polishing slurries as claimed in claim 1 or 2 is used to polish in at least one of the first and second polishing steps.

18. A polishing method according to claim 17, wherein said metal layer contains at least one type selected from copper, a copper alloy, a copper oxide and a copper alloy oxide.

19. A polishing method according to claim 17, wherein said barrier layer has a monolayer structure consisting of one composition or a laminate structure consisting of two or more compositions, and the composition of the barrier layer be selected from among tantalum, tantalum nitride, a tantalum alloy, other tantalum compounds, titanium, titanium nitride, a titanium alloy, other titanium compounds, tungsten, tungsten nitride, a tungsten alloy and other tungsten compounds.

* * * * *